(12) United States Patent
Schatzl-Linder et al.

(10) Patent No.: US 11,056,637 B2
(45) Date of Patent: *Jul. 6, 2021

(54) METAL STRIP AND COIL COATING PROCESS

(71) Applicant: VOESTALPINE STAHL GMBH, Linz (AT)

(72) Inventors: Michaela Schatzl-Linder, Buchkirchen (AT); Bernhard Jakoby, Linz (AT); Wolfgang Hilber, Gutau (AT); Johannes Sell, Linz (AT); Herbert Enser, Linz (AT); Siegfried Bauer, Linz (AT); Markus Krause, Hellmonsödt (AT)

(73) Assignee: voestalpine Stahl GmbH, Linz (AT)

( * ) Notice: Subject to any disclaimer, the term of this patent is extended or adjusted under 35 U.S.C. 154(b) by 95 days.

This patent is subject to a terminal disclaimer.

(21) Appl. No.: 16/065,286

(22) PCT Filed: Aug. 10, 2016

(86) PCT No.: PCT/EP2016/069086
§ 371 (c)(1),
(2) Date: Sep. 7, 2018

(87) PCT Pub. No.: WO2017/108213
PCT Pub. Date: Jun. 29, 2017

(65) Prior Publication Data
US 2019/0378969 A1     Dec. 12, 2019

(30) Foreign Application Priority Data
Dec. 23, 2015 (EP) ..................................... 15202647

(51) Int. Cl.
*H01L 41/08*     (2006.01)
*G01J 5/34*      (2006.01)
(Continued)

(52) U.S. Cl.
CPC ............ *H01L 41/0825* (2013.01); *G01J 5/34* (2013.01); *H01L 27/16* (2013.01); *H01L 27/20* (2013.01);
(Continued)

(58) Field of Classification Search
CPC .................................................... H01L 41/0825
See application file for complete search history.

(56) References Cited

U.S. PATENT DOCUMENTS

| | | |
|---|---|---|
| 4,060,729 A | 11/1977 | Byer et al. |
| 4,379,971 A | 4/1983 | Smith et al. |

(Continued)

FOREIGN PATENT DOCUMENTS

| | | |
|---|---|---|
| CN | 102003998 B | 11/2011 |
| EP | 1798732 A1 | 6/2007 |
| EP | 2605280 A1 | 6/2013 |

*Primary Examiner* — Austin Murata (57) ABSTRACT

A metal strip and a coil coating process for multilayer coating of an endless metal strip are disclosed in which a curable polymer primer is applied to a flat side of the metal strip with the aid of a roller application in order to form an electrically insulating primer layer, a curable polymer varnish is applied to this primer layer with the aid of a roller application and cured in order to form an electrically insulating varnish layer, and at least one electric conductor layer is printed at least in some areas between the primer layer and the varnish layer. In order to enable a stable and inexpensive electrical functionalization of a metal strip, it is proposed that an electrically polarizable layer be applied to at least some regions of the electric conductor layer and that the electric conductor layer and electrically polarizable layer be applied by means of a wet-on-wet process.

13 Claims, 5 Drawing Sheets

(51) Int. Cl.

| | |
|---|---|
| *H01L 27/16* | (2006.01) |
| *H01L 27/20* | (2006.01) |
| *H01L 37/02* | (2006.01) |
| *H01L 41/047* | (2006.01) |
| *H01L 41/193* | (2006.01) |
| *H01L 41/29* | (2013.01) |
| *H01L 41/317* | (2013.01) |

(52) U.S. Cl.
CPC .......... *H01L 37/02* (2013.01); *H01L 41/0478* (2013.01); *H01L 41/193* (2013.01); *H01L 41/29* (2013.01); *H01L 41/317* (2013.01)

(56) References Cited

U.S. PATENT DOCUMENTS

| | | | |
|---|---|---|---|
| 5,153,859 A * | 10/1992 | Chatigny | B32B 38/0008 367/140 |
| 6,049,080 A | 4/2000 | Ito | |
| 10,388,455 B2 * | 8/2019 | Schatzl-Linder | B05D 3/0254 |
| 2006/0176350 A1 | 8/2006 | Howarth et al. | |
| 2007/0215039 A1 | 9/2007 | Edwards et al. | |
| 2007/0283769 A1 | 12/2007 | Glaser et al. | |
| 2009/0039341 A1 | 2/2009 | Marsman et al. | |
| 2009/0236979 A1 | 9/2009 | Han-Adebekun et al. | |
| 2010/0180701 A1 | 7/2010 | Daniel et al. | |
| 2011/0004102 A1 | 1/2011 | Morita | |
| 2013/0328026 A1 | 12/2013 | Bhansali et al. | |
| 2015/0339001 A1 | 11/2015 | Zirkl et al. | |
| 2016/0240769 A1 * | 8/2016 | Abbott, Jr. | B41J 2/14233 |

* cited by examiner

METAL STRIP AND COIL COATING PROCESS

FIELD OF THE INVENTION

The invention relates to a metal strip and a coil coating process for multilayer coating of an endless metal strip in which a curable polymer primer is applied to a flat side of the metal strip with the aid of a roller application in order to form an electrically insulating primer layer, a curable polymer varnish is applied to this primer layer with the aid of a roller application and cured in order to form an electrically insulating varnish layer, and at least one electric conductor layer is printed in at least some areas between the primer layer and the varnish layer.

BACKGROUND OF THE INVENTION

To electrically functionalize a metal strip in the coil coating process, it is known from EP2605280A1 for two endless electric conductor tracks and photovoltaic cells that are contacted by them to be provided between an electrically insulating primer on the metal strip and a top varnish layer on the primer. The primer and top varnish layer are applied with the aid of a roller application—the electric conductor tracks and the photovoltaic cells can also be printed. There is no prior art, however, that discloses functionalizing a metal strip in the coil coating process with electrically active elements.

Based on the prior art explained at the beginning, the stated object of the invention, therefore, is to create a coil coating process that is able to reproducibly provide a metal strip with electrically active elements.

SUMMARY OF THE INVENTION

The invention attains the stated object with regard to the coil coating process in that an electrically polarizable layer is applied to at least some regions of the electric conductor layer, with the electric conductor layer and electrically polarizable layer being applied by means of a wet-on-wet process.

If an electrically polarizable layer is applied to at least some regions of the electric conductor layer, then with regard to an electrical functionality, the metal strip can already be prepared by means of the coil coating method. In this connection, however, it has surprisingly turned out that such an application of an electrically polarizable layer using the coil coating method requires particular care in order, for example, to be able to ensure a high breakdown resistance for the subsequent polarization of the applied electrically polarizable layer.

In order to enable this, the invention also proposes that the electric conductor layer and the electrically polarizable layer be applied by means of a wet-on-wet process. It is therefore possible to assure that the electrically polarizable layer is provided on an uncured electric conductor layer, which makes it possible, for example, to smooth out sharp contours in the edge region of the conductor layers. This can not only promote homogeneity of the layer thickness of the applied electrically polarizable layer, but can also avoid singularities in the polarization of the electrically polarizable layer. The method according to the invention can therefore have a comparatively high reproducibility and specifically based on the wet-on-wet application, can also prepare a metal strip for the use of an electric polarization.

In addition, the wet-on-wet application may possibly facilitate a partial merging of the electrically polarizable layer with the conductor layer—which can ensure a reliable and homogeneously integral bonding of them. For example, a transition zone can form, particularly in the form of a mixed layer constituting a boundary layer—which specifically in the case of a metallic conductor layer, manifests itself in a particularly firmly anchored interphase between the conductor layer and the electrically polarizable layer. Such a transition zone can, for example reduce internal stresses in the layer structure.

In those cases in which the wet-on-wet applied layers can only mix with each other to a limited degree or not at all, an optimization of the boundary layer—or in non-mixable conditions, an optimization of the boundary surface between the wet-on-wet applied layers—can be expected, for example in that raised regions on the boundary layer/boundary surface are smoothed. In general, it should be noted that a wet-on-wet application of these two layers can produce a smoothed boundary layer or boundary surface between them. All of these advantages can also excel as factors that promote the reproducibility of the method.

In general, it is noted that the metal strip can be comprised of a steel strip, an aluminum strip, or alloys thereof. This metal strip can be uncoated or can be coated—for example in an organic/metallic way, for example by being galvanized or alloy galvanized. This metal strip can also be a galvanized or alloy galvanized steel strip. In general, it should also be noted that the conductor layer and electrically polarizable layer can be wet-on-wet applied in such a way that permits the two layers to merge at least at their boundary layers.

The method according to the invention can be particularly well-suited to functionalizing the metal strip with sensors, in that a piezoelectric and/or pyroelectric property in the electrically polarizable layer is produced by means of a polarization. It is thus specifically possible to reproducibly provide sensors for contactless switch elements such as scanners or infrared sensors directly on the metal strip.

If a PVDF (polyvinylidine fluoride) layer is applied as an electrically polarizable layer, then it is possible to produce a layer with ferroelectric—i.e. piezoelectric and pyroelectric—properties in a particularly simple way from a process standpoint. For example, P(VDF-TrFE) (vinylidene fluoride trifluoroethylene copolymer) can be an excellent option as the PVDF (polyvinylidene fluoride) layer for the formation of such a ferroelectric layer. In the solution according to the invention, such PVDF-based polymer layers exhibit outstanding pyroelectric and piezoelectric properties. It is therefore possible to produce functional layers of high grade and quality.

If PEDOT:PSS is applied as the electric conductor layer, this can further facilitate the functionalization of the metal strip and thus further increase the reproducibility of the coil coating process.

The electrical polarizability of the electrically polarizable layer can also be significantly improved if the electric conductor layer is dried before the electrically polarizable layer is wet-on-wet applied to this electric conductor layer. It is thus possible to avoid a possibly extensive mixing of the conductor layer with the electrically polarizable layer, which could negatively influence the functional properties of the layers. It is thus possible to ensure an advantageous, sharply defined boundary layer.

Internal stresses in the layers can be further reduced from a process standpoint if the electric conductor layer and the electrically polarizable layer are cured simultaneously. Preferably, this takes place in one work step, for example in order to improve the layers' freedom from internal stress, for example by ensuring continuous process parameters. This can also significantly improve the efficiency of the process because this makes it possible to produce a finished coating of the metal strip in one pass.

If an additional, second electric conductor layer is printed onto the electrically polarizable layer, then in a simple way from a process standpoint, it is possible to achieve a full-featured electrically active element—for example a pyroelectric sensor or a piezoelectric element—with a bottom and top electrode. By means of the printing, it is also possible to simply and therefore inexpensively produce any position and/or form of the electrodes that are composed of the conductor layers. In general, it is conceivable for the first electric conductor layer and the second electric conductor layer to form a sensor matrix.

In order to polarize the electrically polarizable layer in an advantageously uniform way, the first and second conductor layers are electrically contacted and as a result, the electrically polarizable layer is polarized. To accomplish this, the conductor layers are advantageously contacted with the electrodes of a conventional polarization device—for example in accordance with the Sawyer-Tower method. By means of this, it is possible, for example in a single process step, to apply a polarization voltage to all of the electrically active elements that are produced by means of the first and second conductor layers—making it consequently possible for all of the electrically active elements to be polarized in the same way.

In general, it should be noted that this polarization can selectively take place at an elevated ambient temperature in order to accelerate the process according to the invention, but also—as has surprisingly turned out—to improve the quality of the polarization.

In general, it should also be noted that the polarization of the electrically polarizable layer can be carried out in a comparatively easy way from a process standpoint if before the further coating of the second conductor layer, the two conductor layers are electrically contacted so as not to influence the contact resistance.

From a process standpoint, an electric conductor layer can be printed quickly and inexpensively with the aid of a "roller-to-roller" process. This roller-to-roller process can be useful among other things in cases in which other electrical components are to be provided on the primer layer. For example, printing by means of a roller application can be an excellent option in this context in order to improve the effectiveness of this coil coating process.

Preferably, the conductor layer is printed in the form of a pattern in order to increase the reproducibility of the process by means of a repeating pattern.

If a conversion layer is produced on the flat side of the metal strip, it is possible to significantly increase the corrosion resistance of the metal strip. If the curable polymer primer is also applied to this conversion layer, then the bonding strength between the primer and the steel strip can be further increased. These two advantages—especially when combined—can further improve the reproducibility of the method according to the invention.

The bonding strength and printing quality of the conductor layer can be improved if the electric conductor layer is printed onto the primer layer, which has been pre-cured, in particular pre-cured at least to above the gel point. By avoiding a complete curing, it is possible to achieve an improved bonding to adjoining layers. In this connection, a pre-curing of the primer at least to above the gel point, i.e. almost completely cross-linked, produced outstanding results.

The mechanical and also chemical resistance of the coating can be further increased by chemically cross-linking both the primer and the varnish.

Another object of the invention is to increase the functionality of a metal strip that is coated with the aid of a coil coating method, but without thereby jeopardizing the durability of the coating on the metal strip or increasing production costs.

The invention attains the stated object in that the metal strip has an electrically polarized layer, which adjoins the conductor layer by means of a boundary layer or boundary surface that forms due to a wet-on-wet application of these two layers.

If the metal strip has an electrically polarized layer, then the functionality of the metal strip can be improved with regard to the use of technical effects of the polarized layer. In order to nevertheless not have to expect a reduction in the durability of the metal strip—for example due to a winding into a coil—, it is possible for the electrically polarized layer to adjoin the conductor layer by means of a boundary layer or boundary surface that forms due to a wet-on-wet application of these two layers. In general, it should be noted that this boundary layer (in layers that can mix with each other) or this boundary surface (in layers that cannot mix with each other) is for example smoothed by the wet-on-wet application. It is thus possible to reduce irregularities and local stress concentrations, which can lead to a rounded contour of the conductor layer and can significantly increase the electrical short-circuit resistance of the coating. It is thus possible to significantly improve the durability of the functionalization of the metal strip.

If the metal strip has a second electric conductor layer provided on the electrically polarized layer, then an electrical connection to the electrically polarized layer can be produced in a structurally simple way.

If the first and second conductor layers and the electrically polarized layer form at least one actuator and/or one sensor on the metal strip, then the metal strip according to the invention can be embodied as both an active and passive functional element. Not least, this permits a plurality of actuators and/or sensors to be positioned next to one another in alternation—and thus for example to form a sensor and actuator matrix. In this context, it can be advantageous if the first and second conductor layers together span a network of conductor tracks. For example, it is conceivable for the first conductor layer to form the conductor tracks for the column control of the sensor and actuator matrix and for the second conductor layer to form the conductor tracks for its row control.

If the actuator and sensor, which are connected to each other electrically, cooperate to provide oscillation compensation on the metal strip, then it is possible to achieve an active oscillation compensator in a structurally simple way. If the sensors and actuators are piezoelectric sensors and actuators, then it is possible, for example, to produce a sensor and actuator matrix for actively reducing the noise level. In this case, it is possible for the electrical signals of the acoustic waves to be recorded by the piezoelectric sensors and relayed to the adjoining piezoelectric actuators with possibly altered (for example phase-shifted) signals for the noise damping.

If the electrically polarized layer is pyroelectric and if the sensor is embodied as an infrared sensor, then a heat detector or contactless sensor can be produced in a structurally simple way. Such a contactless infrared sensor can, for example, be suitable for use as a contactless scanner in hygienic environments.

In general, it should be noted that the control electronics for the actuators and sensors can be integrated into or embedded in the electrically polarized layer and conductor layers.

Preferably, the electric conductor layer contains PEDOT:PSS and the electrically polarizable layer contains PVDF, in particular P[VDF-TrFE], in order to be able to ensure a durable functionalization of the endless strip.

BRIEF DESCRIPTION OF THE DRAWINGS

In the figures, the method according to the invention is shown in the form of an embodiment variant. In the drawings.

DETAILED DESCRIPTION OF THE PREFERRED EMBODIMENTS

Figure 1:
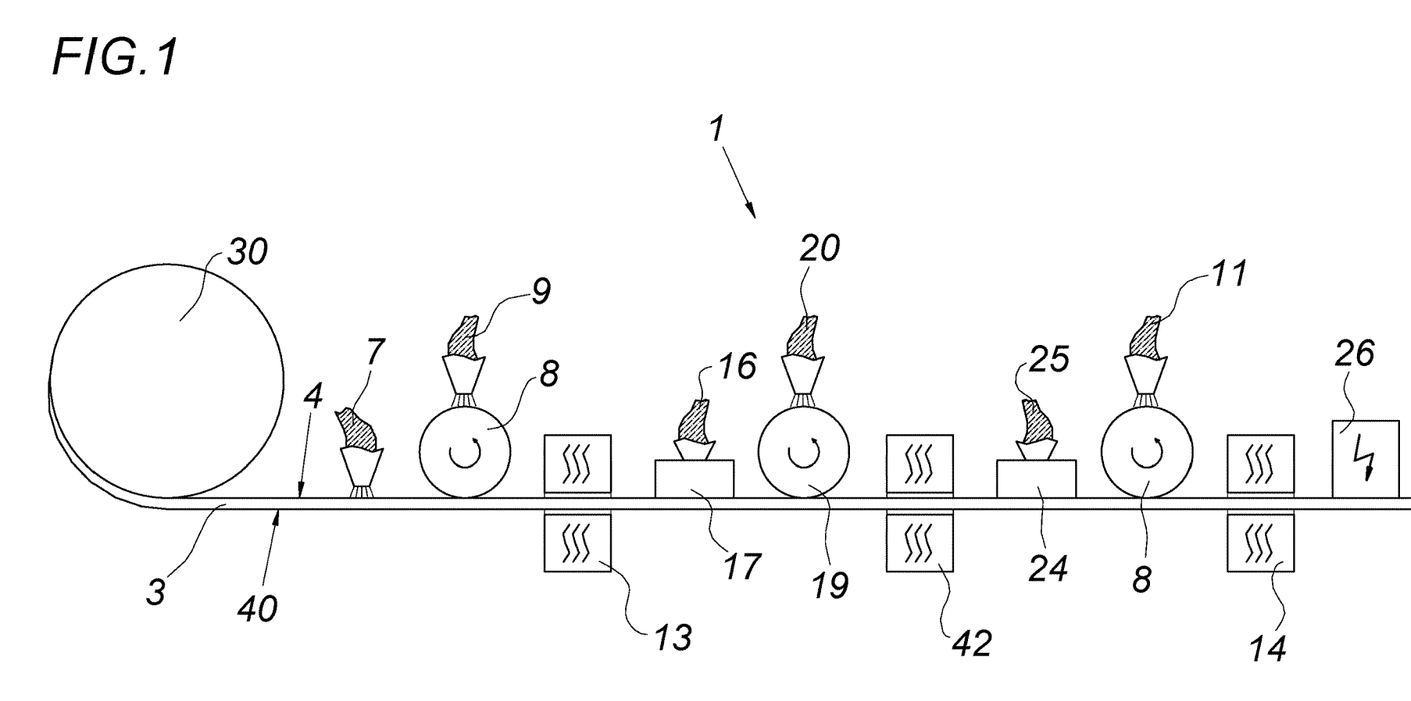
FIG. 1 shows a schematic view of an apparatus for a coil coating process.
Figure 2:
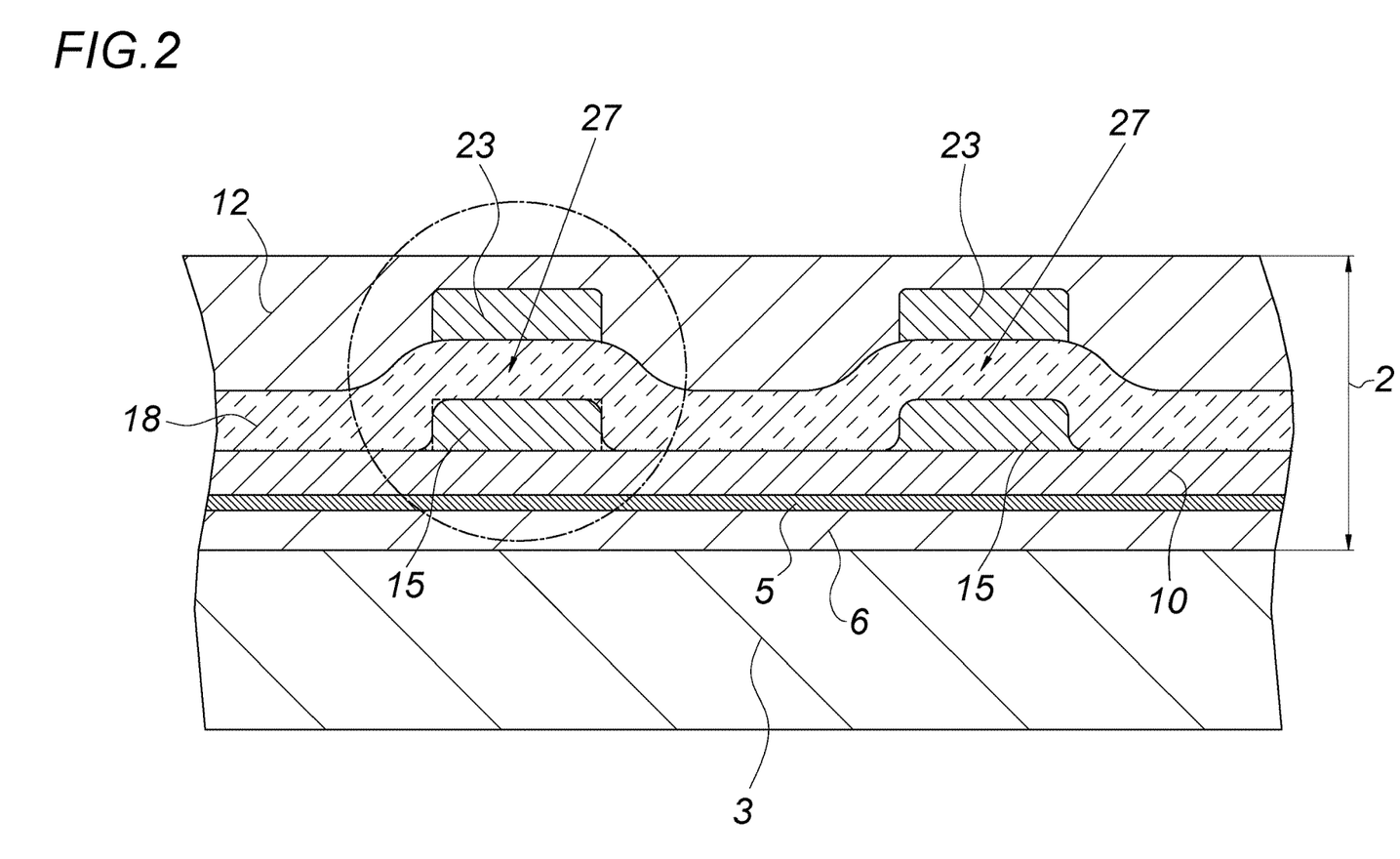
FIG. 2 shows a sectional view through a metal strip that has been coated with the method in FIG. 1 according to a first exemplary embodiment.

FIG. 1 shows an apparatus 1 for carrying out the coil coating process according to the invention, in which an endless metal strip 3, in this case specifically a steel strip, is unwound from a coil 30 and continuously provided with a multilayer coating 2 (in this regard, see FIG. 2).

With the aid of a roller 8 of a coater that is not shown, a curable polymer primer 9 or base coat is applied to a flat side 4 of the metal strip 3 in order to produce an electrically insulating primer layer 10 on this flat side. The primer 9 can, for example, be polyester-based. It is thus possible to increase the bonding strength on the metal strip and/or the corrosion protection of the metal strip 3.

Then a curable polymer and electrically insulating varnish 11, which is likewise polyester-based, for example, is applied to the primer layer 10 on the flat side 4 of the metal strip 3 in order to form an electrically insulating varnish layer 12. This application is carried out—just as is shown for the primer application—with the aid of a roller 8 of a coater that is not shown in detail. The applied polymer 9 and the applied varnish 11 are each cured by means of a drier 13, 14 or cured by chemical cross-linking. It has turned out that the electrical short-circuit resistance of the coating 2 can be increased in that the applied primer 9 for forming the primer layer 10 is pre-cured or pre-dried at least to above its gel point before the conductor layers 15 are applied.

The primer layer 10 and varnish layer 12 are each embodied as electrically insulating in order to be able to provide the metal strip 3 with a desired electrical functionality.

An electrical functionality of this kind is achieved by printing a plurality of electrically conducting conductor layers 15 in some areas with the aid of a roller-to-roller process before the application of the varnish 11. This roller-to-roller process is advantageously carried out with the aid of a printer 17 (digital printing, screen printing, gravure printing, etc.). Such a printing can be carried out in a simple way from a process standpoint by means of a repeating pattern.

An electrically conductive polymer 16 such as PSS (polystyrene sulfonate) in the form of a paste or ink is used to produce the conductor layers 15. Such a paste or ink, however, can instead also be metal-based—for example silver, copper, or gold—, organic-based—for example PEDOT (poly-3,4-ethylenedioxythiophene)—, or graphene-based. Other substances such as carbon or graphite can also conceivably be used for this purpose. Metallic-based inks and/or pastes can be excellent options due to a particularly high conductivity, whereas organic-based inks and/or pastes can for the most part offer an increased corrosion resistance. Excellent results can be achieved by conductor layers 15 preferably composed of PEDOT:PSS, which is applied in the form of an aqueous and/or isopropanol-based dispersion, for example.

These printed conductor layers 15 are then provided with a curable polymer varnish 11. This yields a compact layer structure or a compact coating 2 with conductor layers 15 that are encapsulated in at least some areas—as shown in FIGS. 2 and 3.

Before the varnish 11 is provided, according to the invention, an electrically polarizable layer 18 is provided on the electric conductor layers 15 with the aid of a coater 19. The electrically polarizable polymer 20 that is used in this case is in particular ferroelectric, pyroelectric, and piezoelectric, with a polyvinylidene fluoride (PVDF) base or vinylidene fluoride trifluoroethylene copolymer (P[VDF-TrFE]) base turning out to be particularly advantageous. In this case, the electrically polarizable polymer 20 is printed onto the still-wet electric conductor layers 15—which therefore partially results in a form change in the conductor track contour or a merging of the electrically conductive polymer 16 of the conductor layers 15 and the ferroelectric polymer 20 of the electrically polarizable layer 18. In this way (wet-on-wet application of the layers 15, 18), it is possible to avoid sharp-edged structural boundaries in the transition between the conductor layer 15 and the electrically polarizable layer 18; this feature is shown in FIGS. 2 and 3.

Figure 3:
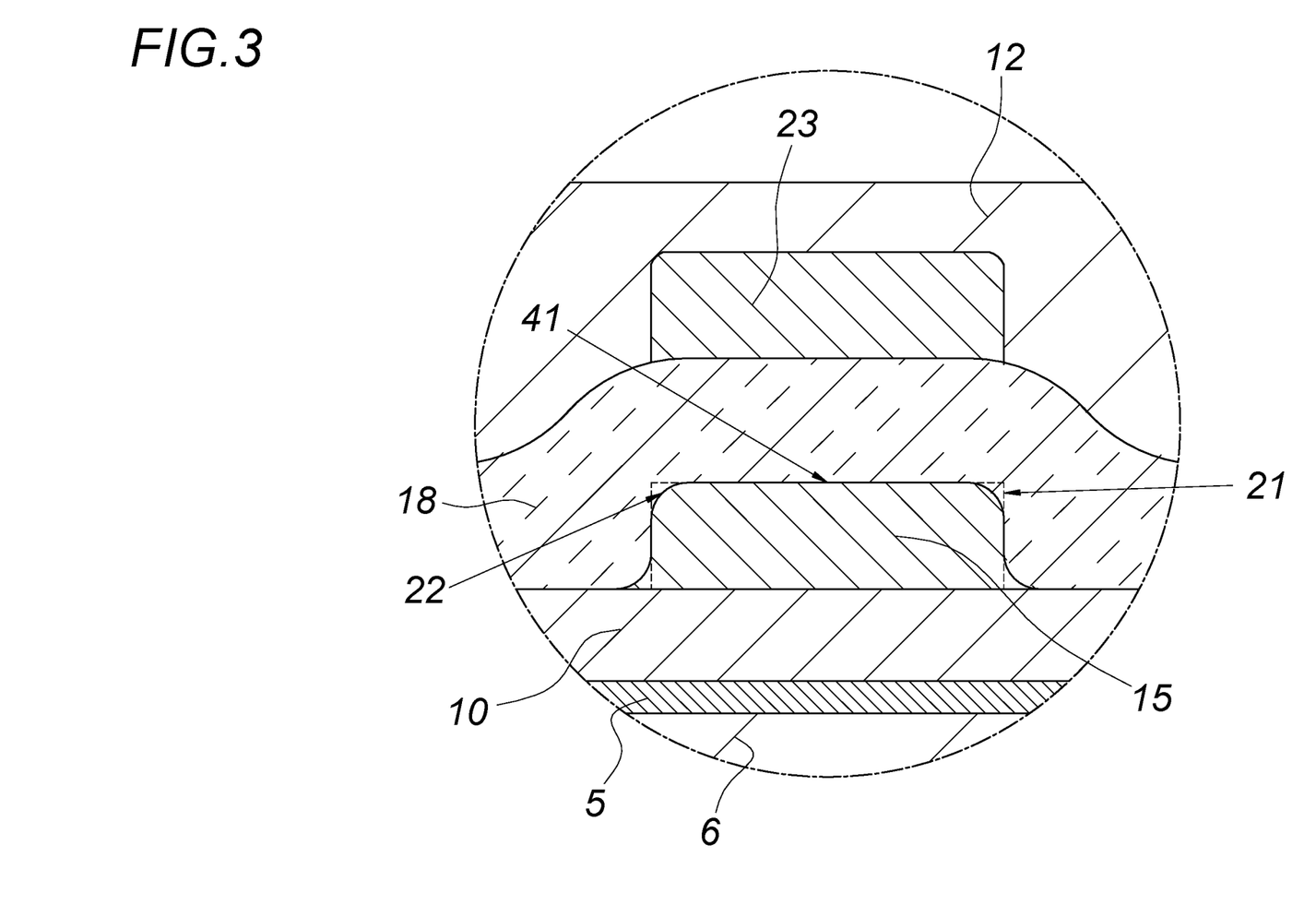
FIG. 3 shows a detail view from FIG. 2.

FIG. 3 in particular indicates that before the application of the electrically polarizable layer 18, the contour 21 of the conductor layers 15 exhibits a sharp-edged shape—shown with dashed lines—whereas the contour 22 of the conductor layers 15 is significantly more rounded after the application of the electrically polarizable layer 18.

It is thus possible to smooth the boundary layer 41 or the boundary surface 41 by means of a wet-on-wet application of these two layers 15, 18. This should prevent irregularities and sharp-edged structural boundaries between the conductor layer 15 and the electrically polarizable layer 18. For example, the boundary layer 41 or boundary surface 41 that is produced by the wet-on-wet application results in a high breakdown resistance of the electrical functionalization of the coating 2. In addition, this also increases the bonding strength of the layers and thus the durability of the metal strip 3.

In order to be able to better control this contour shape 22 of the conductor layers 15, it is possible to pre-dry the conductor layers 15 before the application of the electrically polarizable layer 18. It is particularly advantageous in this regard to pre-dry the conductor layers 15 to a point before their gel point of the polymer 16 in order, with potentially mixable layers, to avoid a mixing of these layers 15, 18.

After the application of the electrically polarizable layer 18, this layer—and the electric conductor layers 15 as well—can be cured. This drying and/or curing can take place together in one work step in a drying unit 42. Then, the electrically polarizable layer 18 preferably has a dry layer density of at least 2 μm.

Another electric conductor layer 23 is printed onto the electrically polarizable layer 18 with the aid of a corresponding printer 24. Both the same printing process and the same electrically conductive polymers 25 can be used in this case. But it is equally conceivable for the electrically conductive polymers 16 and 25 to differ from each other in their composition and in their base material.

The two electric conductor layers 15 and 23 are then contacted by an electric polarization device 26, which polarizes the electrically polarizable layer 18 between the conductor layers 15 and 23. After the polarization has been carried out, functional, electrically active elements 27 are produced between these two opposing conductor layers 15, 23. The polarization should take place before the application of the electrically insulating varnish layer 12. The electrically active elements 27 can, for example, be piezoelectric and/or pyroelectric sensors and/or actuators.

Before the application of the electrically insulating primer layer 10 on the upper flat side 4 of the metal strip 3, a conversion layer 5 is also produced—specifically on the metallic protective layer 6 of the metal strip 3. This conversion layer 5 is produced, for example according to FIG. 1, by being applied, for example by means of the spraying of a solution 7.

The coating of the other flat side 40 of the metal strip 3 in the coil coating process, which flat side 40 is situated opposite from the flat side 4, is not shown in detail in FIG. 1. This can take place in a similar fashion to the coating of the flat side 4—for example in that a conversion layer is first applied and then a varnish such as a primer is applied to this conversion layer; this is not shown, however. It is thus possible to protect the flat side 40 from flash rust, white rust, or other environmental influences.

Figure 4:
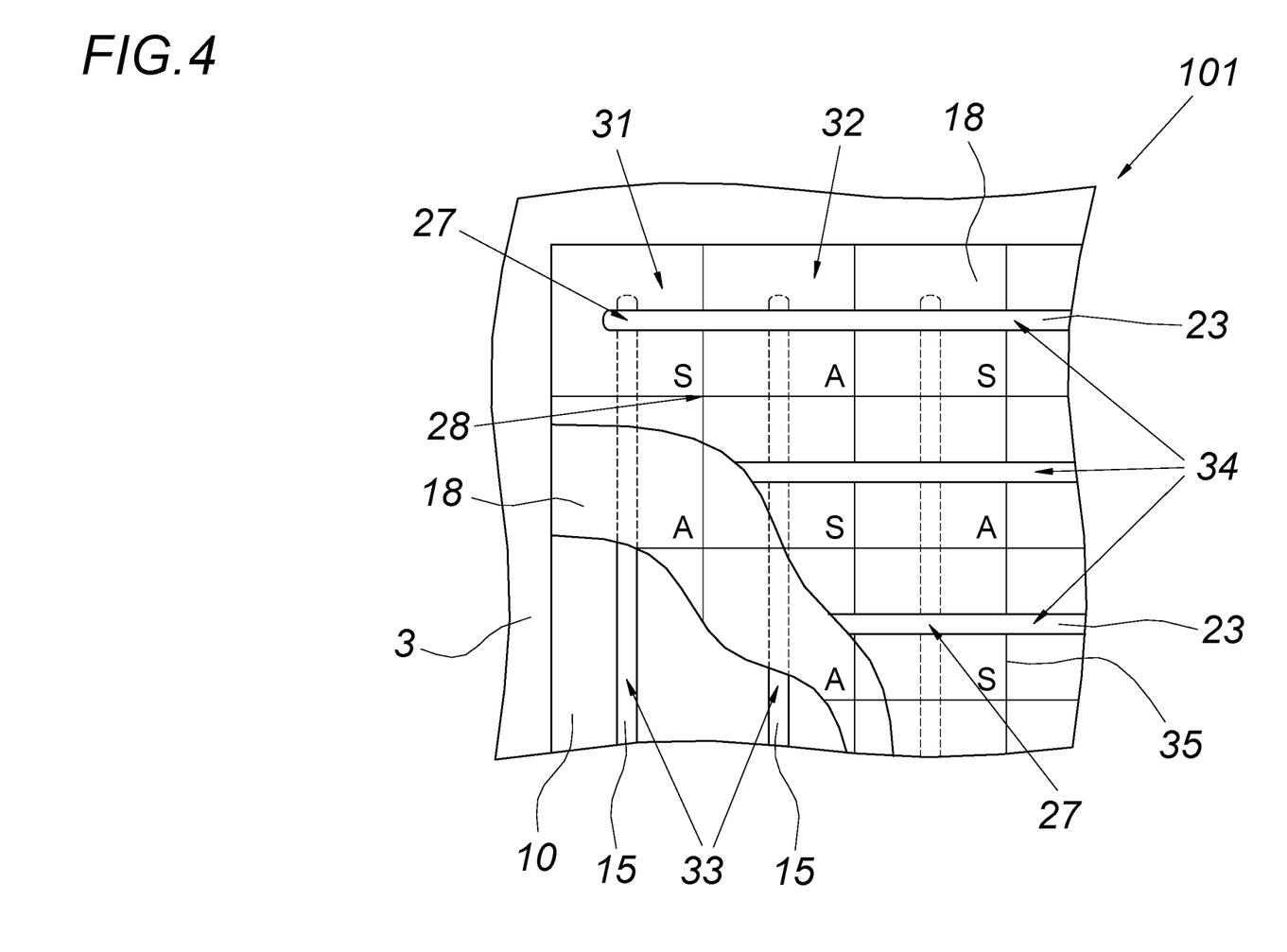
FIG. 4 shows a coated metal strip with piezoelectric sensors and actuators.

FIG. 4 shows a coated metal strip 101 onto which a sensor and actuator matrix 28 has been applied with the coil coating process 1 according to the invention. In this case, the electrically polarized layer 18 is embodied in a predetermined pattern, for example in the form of alternating piezoelectric sensors 31 (labeled with the letter S) and piezoelectric actuators 32 (labeled with the letter A), which are arranged in a sensor and actuator matrix 28. The first conductor layer 15 in this case forms conductor tracks 33 that are spaced a constant distance apart from each other in parallel fashion, which constitute the column control of the sensor and actuator matrix 28 and (as shown in FIG. 2) are positioned below the electrically polarized layer 18. Above the electrically polarized layer 18, the second conductor layer 23 forms conductors 34 that are spaced a constant distance apart from each other in parallel fashion, which constitute the row control of the sensor and actuator matrix 28. There are thus electrically active elements 27 in the electrically polarized layer 18 at the crossing points of the conductor tracks 33 and 34. The piezoelectric sensors 31 and piezoelectric actuators 32 can also be physically separated from one another in the electrically polarized layer 18. The piezoelectric sensors 31 and piezoelectric actuators 32 can also be physically separated from one another in the electrically polarized layer 18, for example by means of open places 35 as indicated in FIG. 4. Such a matrix 28 can, for example, be used for active noise level reduction in that the noise is measured by means of the piezoelectric sensors 31 and is converted into an electric signal and a correspondingly modified signal is sent to the piezoelectric actuators 32 in order to cancel out the noise (for example in that the incoming noise and the generated noise destructively cancel each other out).

Figure 5:
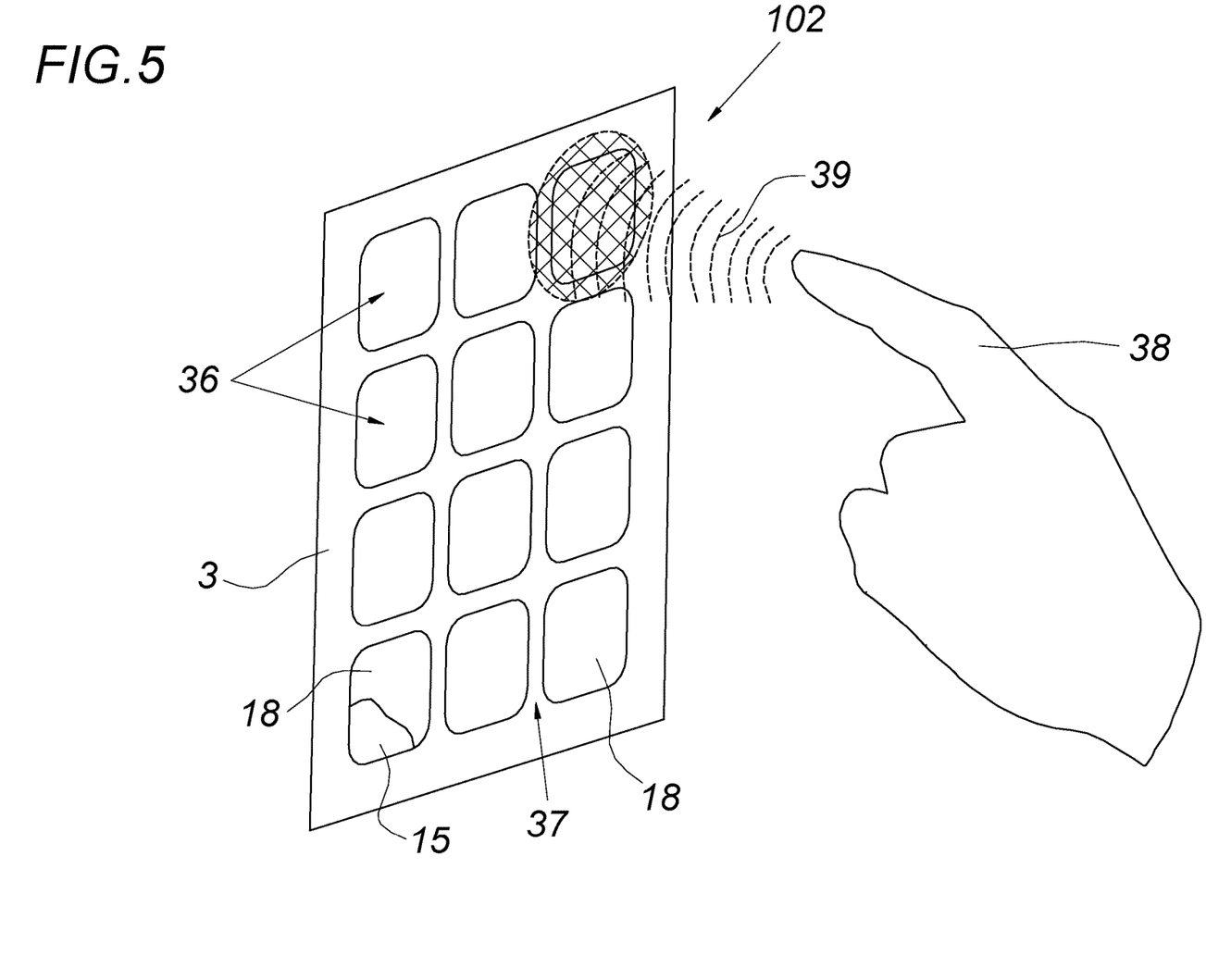
FIG. 5 shows a coated metal strip with pyroelectric infrared sensors.

FIG. 5 shows another exemplary embodiment of a coated metal strip 102. In this case, the metal strip 3 is provided with a pyroelectric layer 18, which cooperates with the first and second electric conductor layers 15, 23 to form infrared sensors 36. In this case, the infrared sensors 36 can form a sensor matrix 37, for example in order to create a control panel on the coated metal strip 102. The infrared radiation 39 emanating from an object 38 arrives at a sensor 36 and in so doing, is converted into an electrical signal, which can, for example, be processed by associated electronics. It is thus possible, for example, to create a contactless control panel or also a motion sensor on the metal strip 102.

The invention claimed is:

1. A coil coating process for multilayer coating of an endless metal strip, comprising:
    applying a curable polymer primer to a flat side of the metal strip with the aid of a roller application in order to form an electrically insulating primer layer;
    applying a curable polymer varnish to the primer layer with the aid of a roller application and curing the polymer varnish in order to form an electrically insulating varnish layer;
    printing at least one electric conductor layer including a first electric conductor layer at least in some areas between the primer layer and the varnish layer; and
    applying an electrically polarizable layer to at least some regions of the electric conductor layer, and applying the electric conductor layer and the electrically polarizable layer using a wet-on-wet process.

2. The coil coating process according to claim 1, comprising producing a piezoelectric and/or pyroelectric property in the electrically polarizable layer using a polarization.

3. The coil coating process according to claim 1, comprising applying PEDOT:PSS as the electric conductor layer and/or applying a PVDF layer as the electrically polarizable layer.

4. The coil coating process according to claim 1, wherein the electric conductor layer and the electrically polarizable layer are cured simultaneously.

5. The coil coating process according to claim 1, further comprising printing a second electric conductor layer onto the electrically polarizable layer.

6. The coil coating process according to claim 5, wherein the first and second electric conductor layers are electrically contacted and as a result, the electrically polarizable layer is polarized.

7. The coil coating process according to claim 1, comprising printing the electric conductor layer with the aid of a roller-to-roller process.

8. The coil coating process according to claim 7, wherein the electric conductor layer is printed in a pattern.

9. The coil coating process according to claim 1, wherein on the flat side of the metal strip, a conversion layer is produced onto which the curable polymer primer is applied.

10. The coil coating process according to claim 1, wherein the electric conductor layer is printed onto the primer layer, which has been pre-cured at least to above a gel point.

11. The coil coating process according to claim 1, wherein both the primer and the varnish are chemically cross-linked.

12. The coil coating process according to claim 1, comprising applying PEDOT:PSS as the electric conductor layer and/or applying a P[VDF-TrFE] layer as the electrically polarizable layer.

13. The coil coating process according to claim 1, comprising printing the electric conductor layer with the aid of a roller application.

\* \* \* \* \*